United States Patent
Satou et al.

(10) Patent No.: US 12,154,920 B2
(45) Date of Patent: Nov. 26, 2024

(54) CAMERA MODULE HAVING CURVED IMAGER

(71) Applicant: DENSO CORPORATION, Kariya (JP)

(72) Inventors: Kouji Satou, Kariya (JP); Hiroki Sasaki, Kariya (JP); Shotaro Miyawaki, Kariya (JP); Akira Wada, Kariya (JP); Satoru Wakiyama, Kariya (JP); Kazuhiro Aoyama, Kariya (JP)

(73) Assignee: DENSO CORPORATION, Kariya (JP)

( * ) Notice: Subject to any disclaimer, the term of this patent is extended or adjusted under 35 U.S.C. 154(b) by 424 days.

(21) Appl. No.: 17/348,884

(22) Filed: Jun. 16, 2021

(65) Prior Publication Data
US 2021/0399034 A1     Dec. 23, 2021

(30) Foreign Application Priority Data
Jun. 19, 2020    (JP) .................................. 2020-105725

(51) Int. Cl.
*H01L 27/146*    (2006.01)
*G02B 7/02*       (2021.01)
(Continued)

(52) U.S. Cl.
CPC ........ *H01L 27/14618* (2013.01); *G02B 7/028* (2013.01); *H01L 24/48* (2013.01);
(Continued)

(58) Field of Classification Search
CPC ............... H01L 27/14618; H01L 24/48; H01L 27/14625; H01L 2224/48091;
(Continued)

(56) References Cited

U.S. PATENT DOCUMENTS

| 4,233,645 A | * | 11/1980 | Balderes | ............. | H01L 23/4338 |
| | | | | | 361/698 |
| 6,791,072 B1 | * | 9/2004 | Prabhu | ................. | H05K 1/0284 |
| | | | | | 257/E31.117 |

(Continued)

FOREIGN PATENT DOCUMENTS

| JP | 2009297385 A | 12/2009 |
| JP | 2015031937 A | 2/2015 |

(Continued)

*Primary Examiner* — Twyler L Haskins
*Assistant Examiner* — Fayez A Bhuiyan
(74) *Attorney, Agent, or Firm* — Posz Law Group, PLC

(57) ABSTRACT

A camera module is configured to capture an optical image of a target area and includes a lens member, an imager, a light transmitting member, and a seat. The lens member is configured to receive light from the target area. The imager has a curved portion convex in a direction away from the lens member and is configured to capture the optical image formed on the curved portion. The light transmitting member optically couples the lens member and the imager. The seat has a supporting portion that supports an outer rim of the imager and a fluid space defined inside the supporting portion. A heat dissipation fluid undergoes convection in the fluid space. The curved portion is interposed between the light transmitting member and the seat having the supporting portion and the fluid space.

10 Claims, 6 Drawing Sheets

(51) Int. Cl.
*H01L 23/00* (2006.01)
*H04N 23/52* (2023.01)
*H04N 23/54* (2023.01)

(52) U.S. Cl.
CPC ....... *H01L 27/14625* (2013.01); *H04N 23/52* (2023.01); *G03B 2217/002* (2013.01); *H01L 2224/48091* (2013.01); *H04N 23/54* (2023.01)

(58) Field of Classification Search
CPC .......... H01L 2224/29194; G02B 7/028; H04N 23/52; H04N 23/54; H04N 23/55; H04N 23/57; H04N 23/50; H04N 25/71; H04N 25/76; G03B 2217/002; G03B 17/55

See application file for complete search history.

(56) References Cited

U.S. PATENT DOCUMENTS

| | | |
|---|---|---|
| 2006/0086096 A1 | 4/2006 | Ghoshal |
| 2006/0088271 A1 | 4/2006 | Ghoshal |
| 2007/0096112 A1* | 5/2007 | Hoshi .................... H10K 50/80 257/79 |
| 2015/0029369 A1* | 1/2015 | Nagata .................. H04N 23/57 348/294 |
| 2016/0172393 A1* | 6/2016 | Kim ................ H01L 27/14687 348/308 |
| 2020/0031394 A1* | 1/2020 | Kamatani ............ B62D 15/025 |
| 2020/0410654 A1 | 12/2020 | Oyaizu et al. |

FOREIGN PATENT DOCUMENTS

| | | |
|---|---|---|
| JP | 2015-040869 A | 3/2015 |
| JP | 2015-192074 A | 11/2015 |
| KR | 1020060075113 A | 7/2006 |

* cited by examiner

CAMERA MODULE HAVING CURVED IMAGER

CROSS REFERENCE TO RELATED APPLICATION

This application is based on and incorporates herein by reference Japanese Patent Application No. 2020-105725 filed on Jun. 19, 2020.

TECHNICAL FIELD

The present disclosure relates to a camera module.

BACKGROUND

Camera modules configured to capture an optical image of a target area are widely known. For example, general camera modules are configured to capture the optical image formed on a curved portion of an imager convex in a direction away from an incident window.

SUMMARY

According to a first aspect of the present disclosure, a camera module is configured to capture an optical image of a target area and includes a lens member, an imager, a light transmitting member, and a seat. The lens member is configured to receive light from the target area. The imager has a curved portion convex in a direction away from the lens member and is configured to capture the optical image formed on the curved portion by the light that passed through the lens member. The light transmitting member optically couples the lens member and the imager and transmits the light from the lens member toward the imager. The seat has a supporting portion that supports an outer rim of the imager and a fluid space defined inside the supporting portion. A heat dissipation fluid undergoes convection in the fluid space. The curved portion is interposed between the light transmitting member and the seat having the supporting portion and the fluid space.

DETAILED DESCRIPTION

Comparative Example

In the camera module of a comparative example, a space is defined between a sealing glass of the incident window and a curved portion of an imager. Heat generated in the imager may be dissipated to the space. However, in the space that is located on an incident side of the curved portion on which the optical image is formed, a refractive index of air heated by the heat dissipation from the imager may change, and accordingly optical characteristics of the incident light may change. In this case, accuracy in capturing the optical image may deteriorate.

Hereinafter, embodiments will be described with reference to the drawings. In the following description, the same reference symbols are assigned to corresponding components in each embodiment in order to avoid repetitive descriptions. When only a part of the configuration is described in the respective embodiments, the configuration of the other embodiments described before may be applied to other parts of the configuration. Further, not only the combinations of the configurations explicitly shown in the description of the respective embodiments, but also the configurations of the plurality of embodiments can be partially combined together even if the configurations are not explicitly shown if there is no problem in the combination in particular.

First Embodiment

Figure 1:
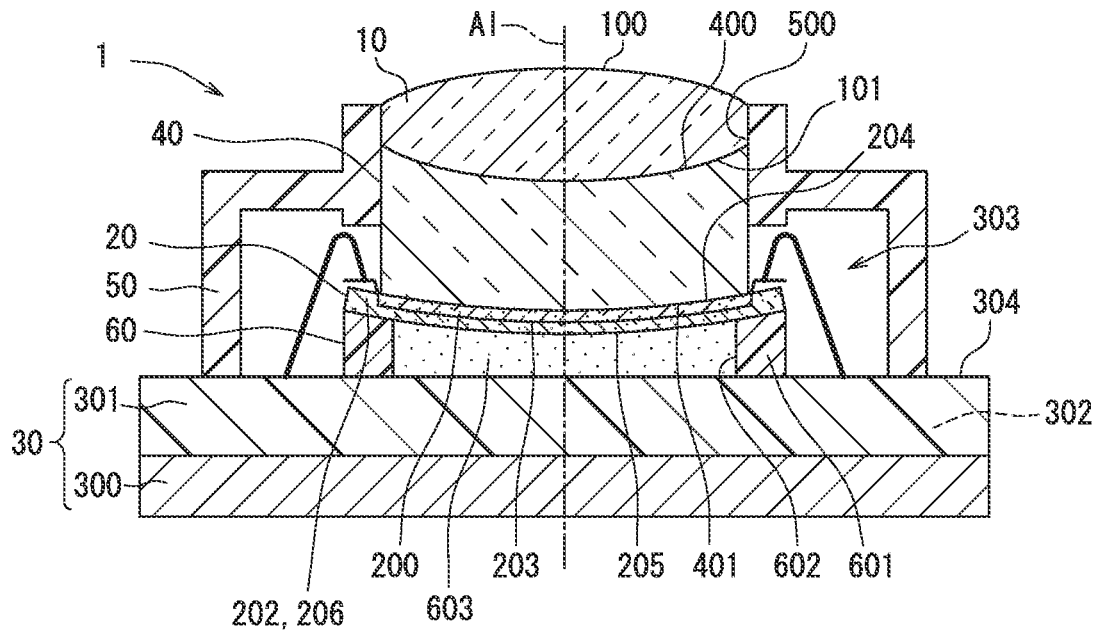
FIG. 1 is a cross-sectional view of a camera module according to a first embodiment.
Figure 2:
FIG. 2 is a schematic diagram illustrating an optical image captured by the camera module according to the first embodiment.
Figure 11:
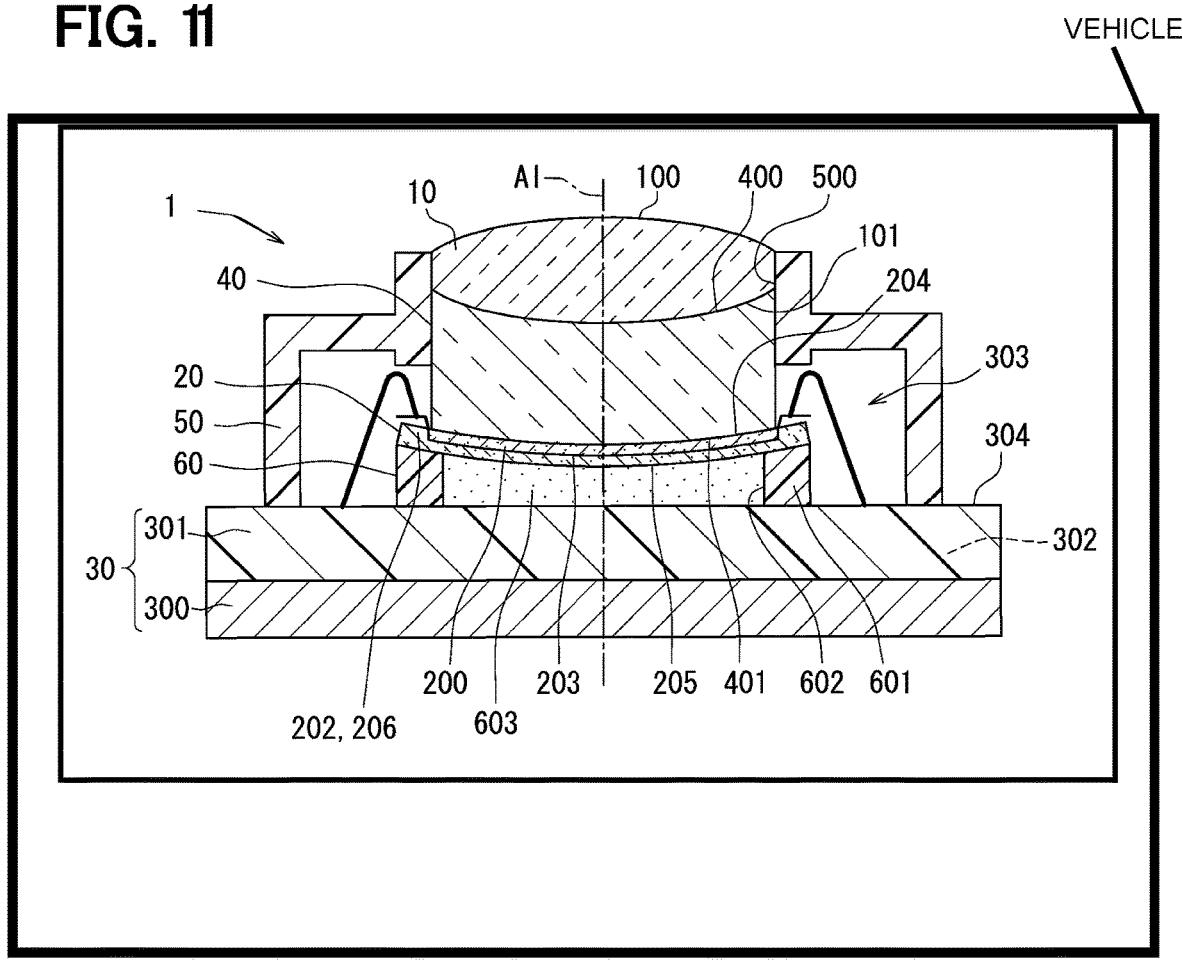
FIG. 11 is a cross-sectional view of a vehicle with a camera module according to the first embodiment mounted thereon.

A camera module 1 of a first embodiment shown in FIG. 1 is configured to capture an optical image 3 of a target area. The camera module 1 is mounted on a vehicle (see FIG. 11) to capture an outside of the vehicle as the target area. The camera module 1 includes a lens member 10, an imager 20, an imaging substrate 30, a light transmitter 40, a lens barrel 50, and a seat 60.

The lens member 10 is located on an optical path of a light ray from the target area. The lens member 10 is made from a transparent hard material having a low coefficient of thermal expansion and a high refractive index, such as glass. The lens member 10 has a single lens structure in front of the imager 20. One side of the lens member 10 is an input lens surface 100 which is a convex lens surface convex toward the target area. The other side of the lens member 10 is an output lens surface 101 which is a convex lens surface convex in a direction away from the target area. The lens surfaces 100, 101 have a curved shape including aspherical and spherical shape in any cross section including the cross section shown in FIG. 1. That is, the lens member 10 of the first embodiment is a biconvex lens having two convex surfaces.

Figure 3:
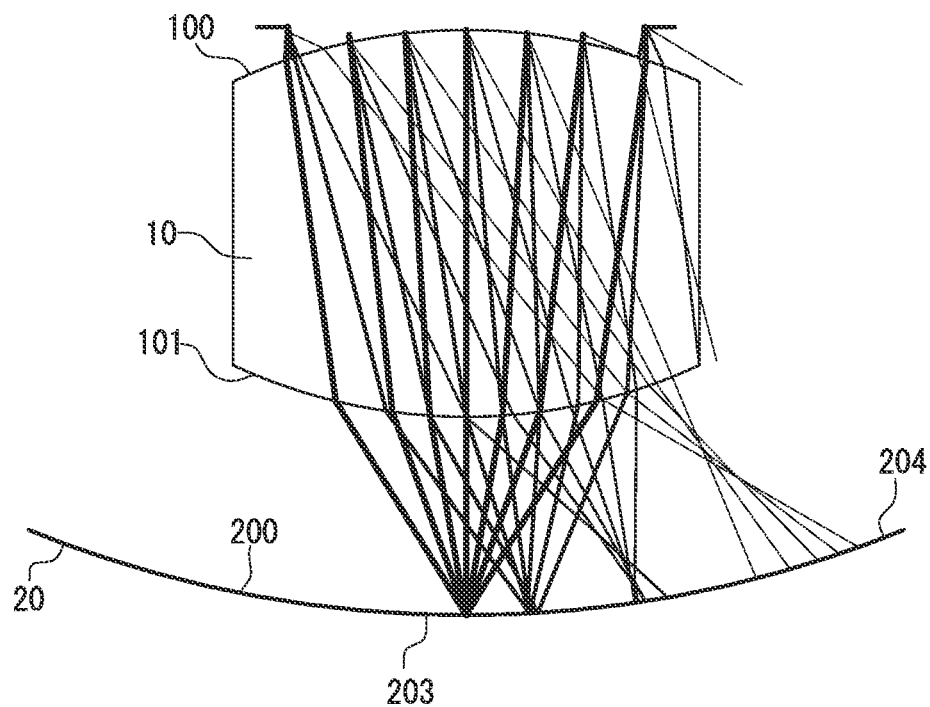
FIG. 3 is a schematic diagram for explaining an optical structure of the camera module according to the first embodiment.

The optical axis of the lens member 10 coincides with the optical axis Al of the light from the target area to the imager 20. Light from the target area enters the lens member 10 along the optical axis Al. The lens member 10 gives optically positive power to the light from the target area by the joint use of the lens surfaces 100, 101 as shown in FIG. 3, and transmits the light to the imager 20. The output lens surface 101 of the lens member 10 can be a curved optical surface convex toward the imager 20.

The imager 20 shown in FIG. 1 is disposed on the optical path of the light from the target area, and is located on the opposite side of the lens member 10 opposite to the target area. The imager 20 is a thin semiconductor device in which an imaging element 200 is mounted on a silicon wafer or the like. The imager 20 has a curved portion 203. The curved portion 203 has an arch shape having a substantially constant thickness. The curved portion 203 is convex in a direction away from the lens member 10. The curved portion 203 of the first embodiment is composed of the entire imager 20. Accordingly, the imager 20 has an arch shape as a whole.

One side of the curved portion 203 is an input concave surface 204 concave in a direction away from the lens member 10. The other side of the curved portion 203 is a heat dissipating convex surface 205 convex in the direction away from the lens member 10. The surfaces 204, 205 have a curved shape including aspherical and spherical shape in any cross section including the cross section shown in FIG. 1. The input concave surface 204 has a curve shape that is substantially complementary to the output lens surface 101 of the lens member 10. The input concave surface 204 may have a gentle or steep curve shape.

The imaging element 200 is a color or monochrome type semiconductor device such as a CCD or CMOS. The imaging element 200 has pixels arranged in a matrix. The imaging element 200 is included in the curved portion 203. The imaging surface of the imaging element 200 is recessed to be a part of the input concave surface 204. An effective imaging region of the imaging element 200 at which the light can be detected is located substantially coaxially with the optical axis Al of the light from the target area to the imager 20. The imaging element 200 of the first embodiment has the effective imaging region inside an outer rim 206 of the curved portion 203 which coincides with an outer rim 202 of the imager 20. That is, the effective imaging region of the imaging element 200 is formed at a part of the curved portion 203 other than the outer rim 206.

As shown in FIG. 3, the imaging element 200 receives the light from the target area that has passed through the lens member 10 along the optical axis Al. Accordingly, the optical image 3 is formed on the effective imaging region of the imaging element 200 in the curved portion 203 due to the positive power of the lens member 10. In contrast, the optical image 3 of the target area is not formed on the outer rim 206 of the curved portion 203 which is located outside the effective imaging region of the imaging element 200. The imaging element 200 is configured to capture the optical image 3 of the target area formed on the effective imaging region and output a capture signal.

The imaging substrate 30 shown in FIG. 1 is disposed out of the optical path of the light from the target area to the imager 20. The imaging substrate 30 is located on the opposite side of the imager 20 with respect to the lens member 10. The imaging substrate 30 is a circuit board having a flat shape extending in a direction perpendicular to the optical axis Al of the light from the target area. The imaging substrate 30 includes a base substrate 300 and a soft flexible printed circuit board (FPC) 301 integrated with each other. The base substrate 300 is made from a hard material having high thermal conductivity such as stainless steel (SUS). An imaging circuit 302 which is a part of the imaging substrate 30 is included in or mounted on the flexible printed circuit board 301 of the imaging substrate 30.

The imaging circuit 302 includes multiple circuit elements. The imaging circuit 302 is wire-bonded to a part 303 of the imager 20 that is located on the outer side of the outer rim 202 of the imager 20. In the first embodiment, the part 303 is located on the outer side of the outer rim 206 of the curved portion 203. Accordingly, the imaging circuit 302 is electrically connected with the imaging element 200 of the imager 20. The imaging circuit 302 is configured to control the capture by the imaging element 200. Accordingly, the imaging circuit 302 is configured to process the capture signal output from the imaging element 200. Further, the imaging circuit 302 may be configured to generate image signals indicating the capture result of the target area by performing image processing on the capture signal output from the imaging element 200.

The light transmitting member 40 is located on the optical path of the light from the target area and between the lens member 10 and the imager 20. The light transmitting member 40 is made of a transparent hard material having a low coefficient of thermal expansion such as glass. The light transmitting member 40 has a thick plate shape and is sandwiched by the lens member 10 and the imager 20.

One side of the light transmitting member 40 is an input concave surface 400 concave toward the imager 20 in the direction away from the lens member 10. The other side of the light transmitting member 40 is an output convex surface 401 convex toward the imager 20 in the direction away from the lens member 10. The surfaces 400, 401 have a curved shape including aspherical and spherical shape in any cross section including the cross section shown in FIG. 1. The input concave surface 400 has a curve shape that is substantially complementary to the output lens surface 101 of the lens member 10. The output convex surface 401 has a curve shape that is substantially complementary to the input concave surface 204 of the imager 20.

The input concave surface 400 is coaxially aligned with and flush against the output lens surface 101. The input concave surface 400 of the first embodiment is physically bonded and fixed to the output lens surface 101 of the lens member 10 by an optical adhesive or the like, and thereby the light transmitting member 40 is integrated with the lens member 10. In contrast, the output convex surface 401 is coaxially aligned with and flush against the input concave surface 204. The output convex surface 401 of the first embodiment is physically separated from the input concave surface 204 of the imager 20 and is stacked on the input concave surface 204 of the imager 20.

Accordingly, the light transmitting member 40 optically couples the lens member 10 and the imager 20 with each other. The light transmitting member 40 transmits the light from the target area having passed through the lens member 10 to the imager 20 along the optical axis Al.

The lens barrel 50 is arranged so as to extend from the periphery of the optical path of the light from the target area toward the imager 20 to a part out of the optical path. The lens barrel 50 is located outside the components 10-40. The lens barrel 50 is made of a light-shielding hard material having a low coefficient of thermal expansion such as thermosetting resin. The lens barrel 50 has a stepped cylindrical shape with openings on both sides.

An opening end portion 500 on the small diameter side of the lens barrel 50 is externally fitted and fixed to the lens member 10 and the light transmitting member 40. An end surface on the large diameter side of the lens barrel 50 is flush against and bonded to a surface 304 of the flexible printed circuit board 301 facing away from the base substrate 300. Accordingly, the lens member 10 and the light transmitting member 40 supported by the lens barrel 50 are indirectly supported by the imaging substrate 30 as well through the lens barrel 50.

The seat 60 shown in FIG. 1 is disposed out of the optical path of the light from the target area to the imager 20. The seat 60 is located on the opposite side of the curved portion 203 of the imager 20 opposite to the lens member 10 and the light transmitting member 40. The seat 60 is located between the curved portion 203 and the flexible printed circuit board 301 of the imaging substrate 30. The seat 60 is made of a light-shielding hard material having a low coefficient of thermal expansion such as thermosetting resin. The seat 60 has a straight cylindrical shape with openings on both sides. The seat 60 includes a supporting portion 601 and a fluid space 602.

The supporting portion 601 is a cylindrical wall or a lateral wall of the seat 60. One side end surface of the supporting portion 601 is flush against and bonded to the outer rim 202 (the outer rim 206 of the curved portion 203 in the first embodiment) of the heat dissipating convex surface 205 of the imager 20. Accordingly, the supporting portion 601 supports the outer rim 202 of the imager 20 on which the optical image 3 of the target area is not substantially formed. The other side end surface of the supporting portion 601 is flush against and bonded to the surface 304 of the flexible printed circuit board 301 of the imaging substrate 30. The lens barrel 50 is also bonded to the surface 304. Accordingly, the imager 20 supported by the supporting portion 601 is indirectly supported by the imaging substrate 30 as well.

The fluid space 602 is defined inside the supporting portion 601. The fluid space 602 is defined by the supporting portion 601, the curved portion 203 of the imager 20, and the flexible printed circuit board 301 of the imaging substrate 30. The heat dissipating convex surface 205 of the curved portion 203 totally covers one opening of the supporting portion 601 and is exposed to the fluid space 602 defined inside the supporting portion 601. The surface 304 of the flexible printed circuit board 301 totally covers the other opening of the supporting portion 601 and is exposed to the fluid space 602. Accordingly, heat generated in the imaging element 200 is dissipated from the heat dissipating convex surface 205 to the fluid space 602. Further, heat generated in the imaging substrate 30 is dissipated from the surface 304 to the fluid space 602. A heat dissipation fluid undergoing convection due to the heat dissipated from the heat dissipating convex surface 205 and the surface 304 is enclosed in the fluid space 602. The air is used as the heat dissipation fluid 603 in the first embodiment.

According to the first embodiment described above, the lens member 10 into which the light from the target area enters and the imager 20 in which the optical image 3 is formed on the curved portion 203 are optically coupled with each other by the light transmitting member 40 that transmits the light from the lens member 10 to the imager 20. According to this, on an incident side of the curved portion 203 from which the light enters the curved portion 203, a change of optical characteristics of the light can be suppressed by the light transmitting member 40 whose refractive index is likely to be stable.

According to the first embodiment, on the opposite side of the curved portion 203 opposite from the light transmitting member 40, the fluid space 602 in which the heat dissipation fluid 603 undergoes convection is defined inside the supporting portion 601 supporting the outer rim 202 of the imager 20. According to this, since the heat dissipated from the curved portion 203 to the fluid space 602 is transferred to the heat dissipation fluid 603, the heat dissipation fluid 603 undergoing convection exhibits the heat dissipation.

According to the first embodiment, high capturing accuracy can be realized by suppressing the change of the optical characteristics, and the heat dissipation can be realized at the same time.

In the fluid space 602 of the first embodiment, the air is enclosed as the heat dissipation fluid 603. According to this, manufacturability and productivity of the structure for heat dissipation can be improved.

The supporting portion 601 of the first embodiment supports the outer rim 202 of the imager 20 on which the optical image 3 is not formed. According to this, a part of the curved portion 203 on which the optical image 3 is formed can be exposed to the fluid space 602 except the outer rim 202 on which the optical image 3 is not formed. Accordingly, both high capturing accuracy and high heat dissipation can be obtained.

In the first embodiment, the imaging substrate 30 connected to the imager 20 by wire-bonding is exposed to the fluid space 602 defined in the cylindrical supporting portion 601 from the other side opposite to the curved portion 203. According to this, since the heat dissipated from the imaging substrate 30 to the fluid space 602 is transferred to the heat dissipation fluid 603, the heat dissipation fluid 603 undergoing convection exhibits the heat dissipation property. Accordingly, high capturing accuracy can be realized by suppressing the change of the optical characteristics, and high heat dissipation property can be realized at the same time.

According to the first embodiment, the lens member 10 and the light transmitting member 40 are supported by the lens barrel 50 fixed to the imaging substrate 30 in addition to the seat 60 supporting the curved portion 203 of the imager 20. According to this, the lens member 10 and the imager 20 sandwiching the light transmitting member 40 can be positioned optically accurately. Accordingly, capture accuracy can be improved in combination with the suppression of changes in optical characteristics.

According to the first embodiment, the lens member 10 having the output lens surface 101 convex toward the imager 20 gives positive power to the light. According to this, the angle of view that determines the target area can be widened even with a small imager 20 by cooperating with the curved portion 203 that curves in the direction away from the lens member 10. Accordingly, it is possible to suppress the change in the optical characteristics of the light from the wide target area and improve the capture accuracy.

According to the light transmitting member 40 of the first embodiment, the input concave surface 400 is flush against the output lens surface 101 of the lens member 10, and the output convex surface 401 is flush against the curved portion 203 of the imager 20. According to this, the lens member 10 and the imager 20 sandwiching the light transmitting member 40 can be positioned optically accurately. Further, the shape of the curved portion 203 of the imager 20 which is required to widen the angle of view can be secured. Accordingly, capture accuracy can be improved in combination with the suppression of changes in optical characteristics.

According to the first embodiment, the input concave surface 400 of the light transmitting member 40 is physically bonded to the output lens surface 101 of the lens member 10. According to this, the lens member 10 and the imager 20 sandwiching the light transmitting member 40 can be positioned accurately. Accordingly, capture accuracy can be improved in combination with the suppression of changes in optical characteristics.

The camera module 1 of the first embodiment is configured to capture the target area outside the vehicle. According to the principle described above, even in a vehicle that tends to get hot, high capturing accuracy can be realized by suppressing the change of the optical characteristics, and high heat dissipation property can be realized at the same time.

Second Embodiment

Figure 4:
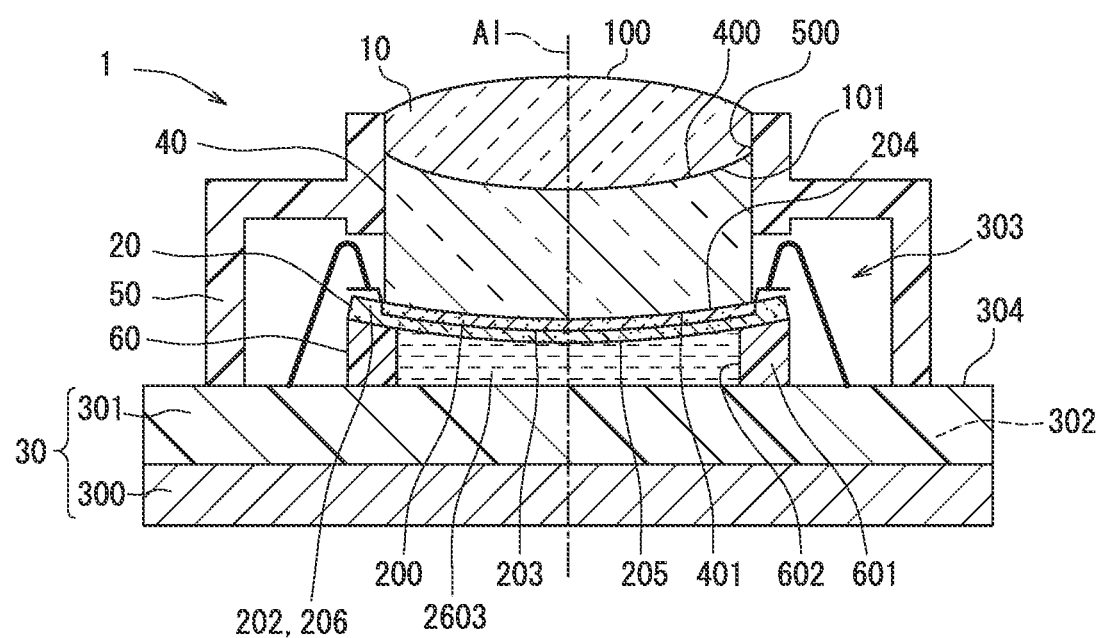
FIG. 4 is a cross-sectional view of a camera module according to a second embodiment.

A second embodiment shown in FIG. 4 is a modification of the first embodiment.

In the second embodiment, a heat dissipation fluid 2603 is enclosed in the fluid space 602 to undergo convection due to the heat dissipated from the heat dissipating convex surface 205 of the curved portion 203 of the imager 20 and from the surface 304 of the of the flexible printed circuit board 301 of the imaging substrate 30. The heat dissipation fluid 2603 may be a liquid metal having a high thermal conductivity of 10 W/m·K or more such as a liquid Ga—In—Sn alloy.

As described above, the heat dissipation fluid 2603 is enclosed in the fluid space 602 of the second embodiment. According to this, it is possible to exhibit high heat dissipation.

OTHER EMBODIMENTS

Although multiple embodiments have been described above, the present disclosure is not construed as being limited to these embodiments, and can be applied to various embodiments and combinations within a scope that does not depart from the gist of the present disclosure.

Figure 5:
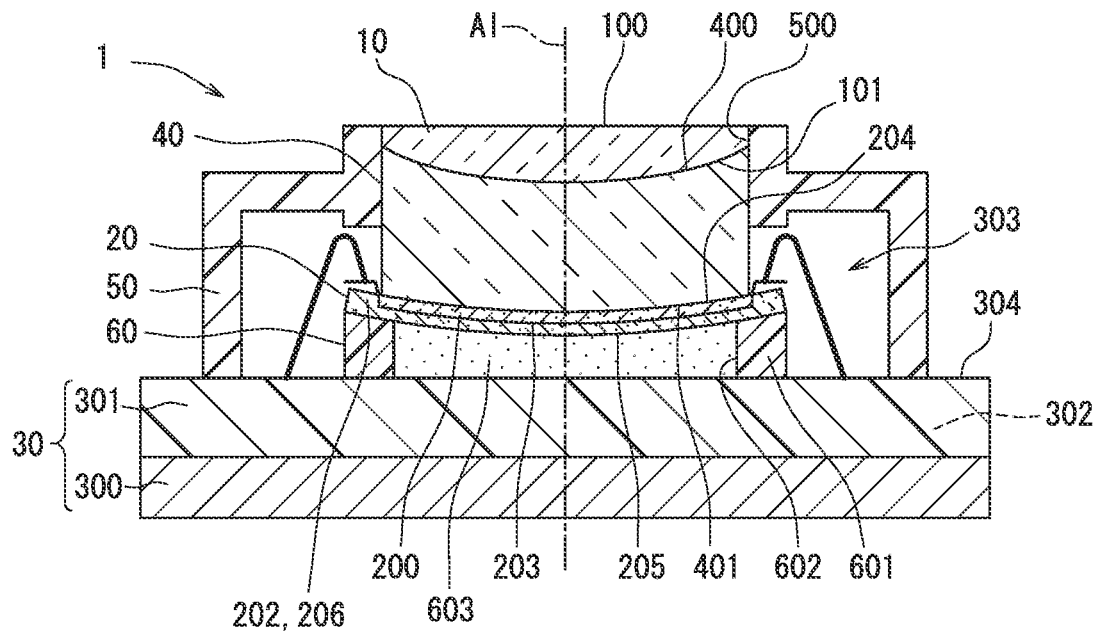
FIG. 5 is a cross-sectional view of a modification example of FIG. 1.

In one modification example of the first and second embodiments, the lens member 10 may be a single-convex lens in which only the output lens surface 101 is convex as shown in FIG. 5. In this case, the input lens surface 100 may be a flat surface as shown in FIG. 5 or a concave surface (not shown) as long as the lens member 10 gives positive power to the light passing therethrough.

Figure 6:
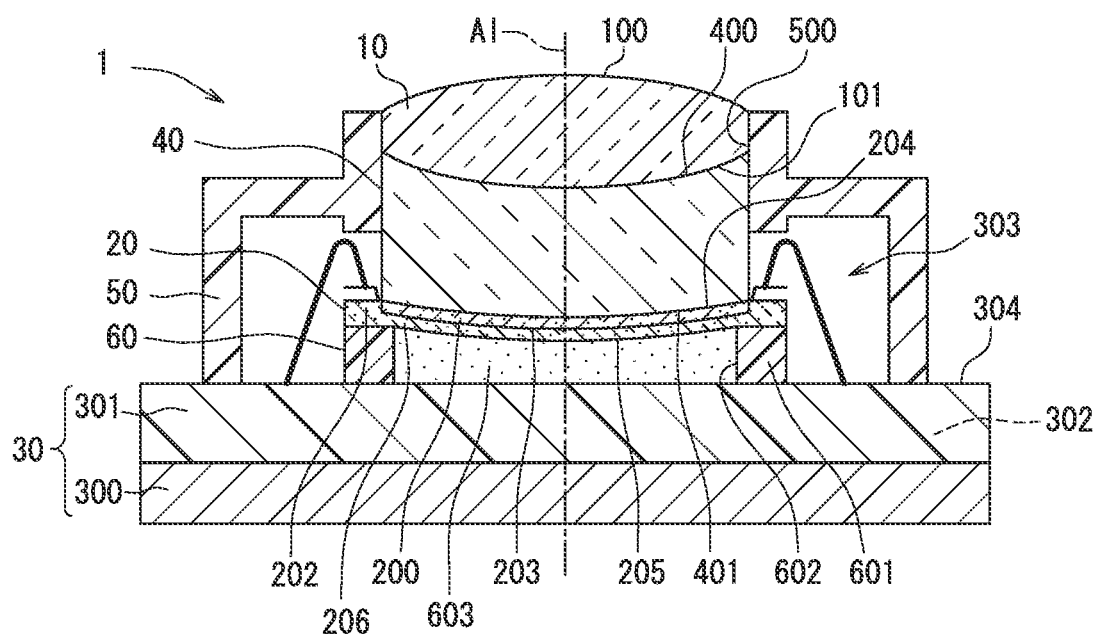
FIG. 6 is a cross-sectional view of a modification example of FIG. 1.

In another modification example of the first and second embodiments, the outer rim 202 of the imager 20 supported by the supporting portion 601 of the seat 60 may be flat as shown in FIG. 6. In this case, the curved portion 203 of the imager 20 is located inside the outer rim 202 as shown in FIG. 6. Further in this case, the effective imaging region of the imaging element 200 is formed in at least a part of the curved portion 203 located inside the outer rim 202 of the imager 20.

Figure 7:
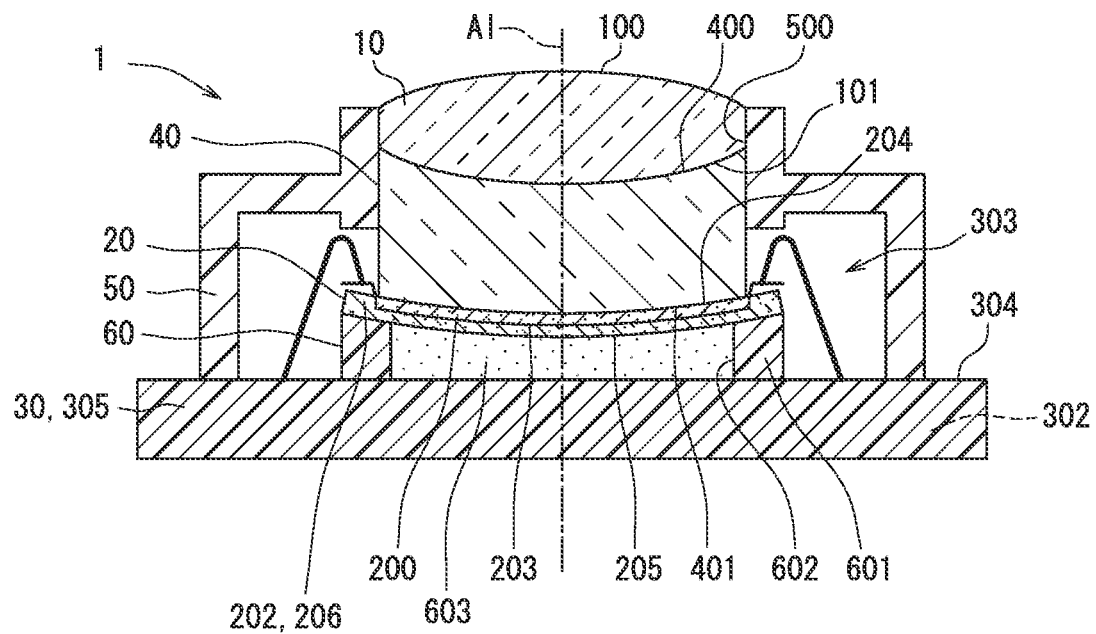
FIG. 7 is a cross-sectional view of a modification example of FIG. 1.

In another modification example of the first and second embodiments, the imaging substrate 30 may be a printed circuit board 305 with printed wiring on a base material such as resin, ceramics, or alumina as shown in FIG. 7. In this case, the surface 304 is one side of the printed circuit board 305.

Figure 8:
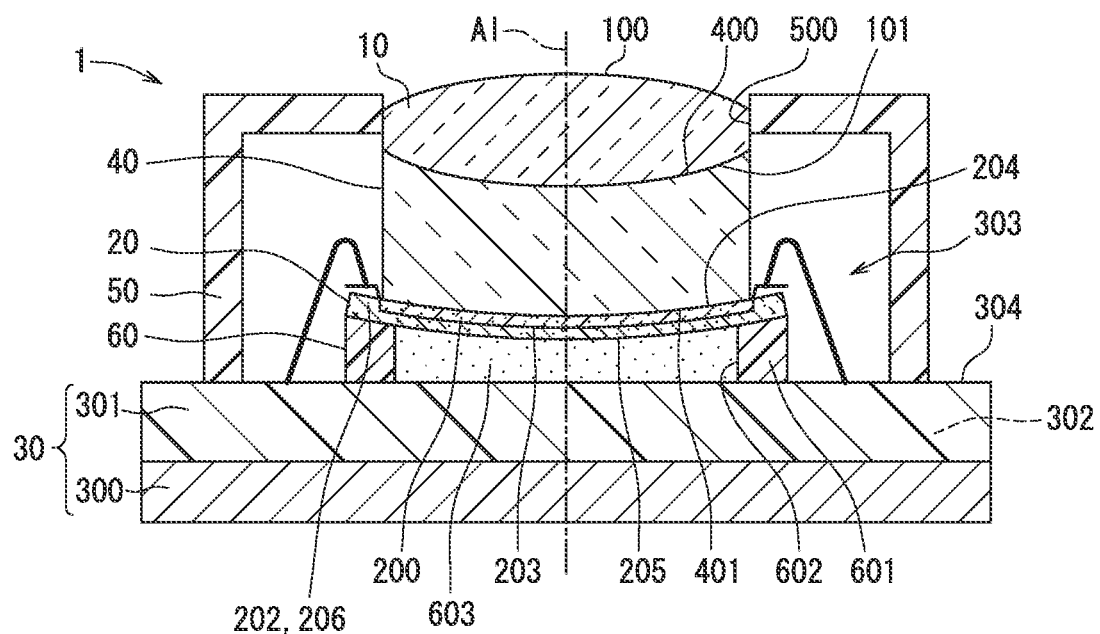
FIG. 8 is a cross-sectional view of a modification example of FIG. 1.

In another modification example of the first and second embodiments, one of the lens member 10 or the light transmitting member 40 which are physically bonded to each other is not supported by the lens barrel 50 as shown in FIG. 8. In FIG. 8, the light transmitting member 40 is not supported by the lens barrel 50. In another modification example of the first and second embodiments, the light transmitting member 40 may be physically separated from the lens member 10, and the input concave surface 400 of the light transmitting member 40 may be stacked on the input lens surface 101 of the lens member 10.

Figure 9:
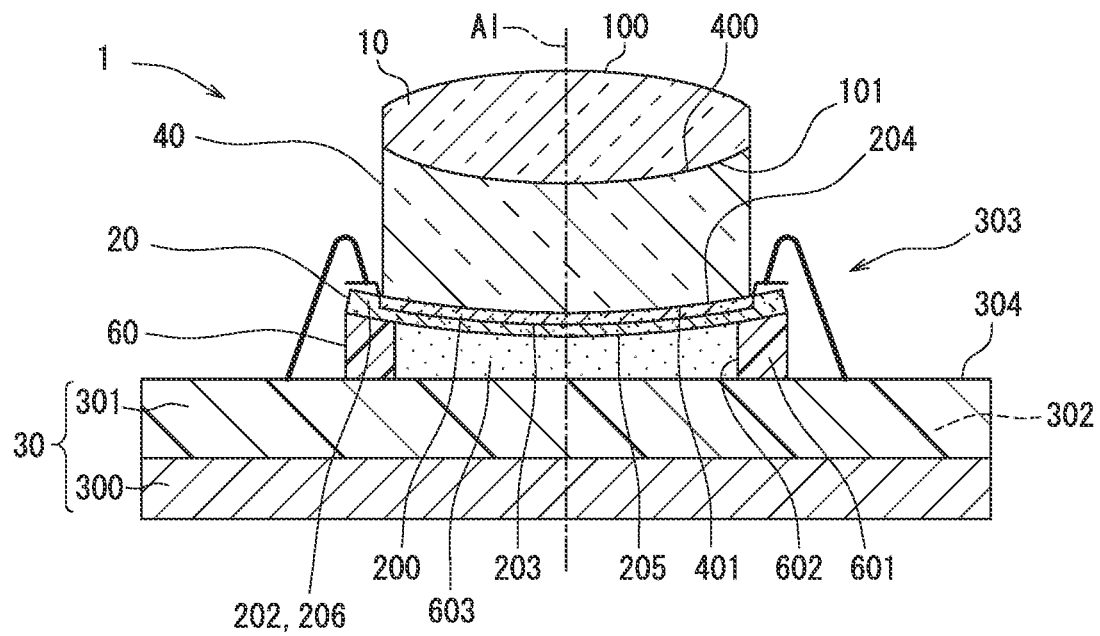
FIG. 9 is a cross-sectional view of a modification example of FIG. 1.

In another modification example of the first and second embodiments, the output convex surface 401 of the light transmitting member 40 may be physically bonded to the input concave surface 204 of the imager 20 by optical adhesive or the like. In this case, the lens barrel 50 may be omitted as shown in FIG. 9.

Figure 10:
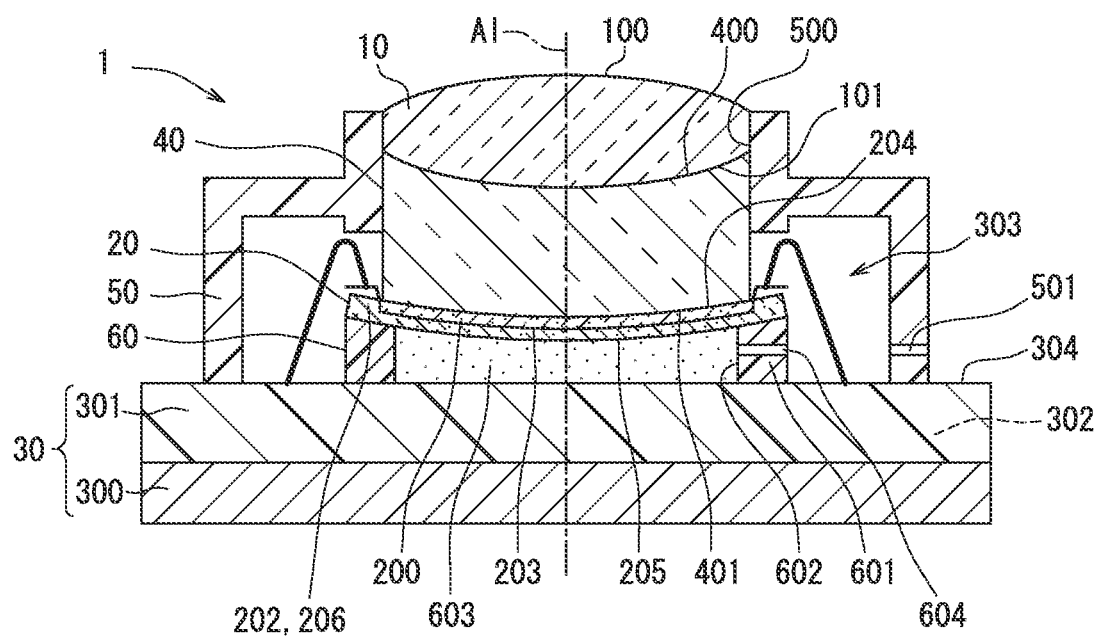
FIG. 10 is a cross-sectional view of a modification example of FIG. 1.

In one modification example of the first embodiment, the supporting portion 601 of the seat 60 may have a vent hole 604 through which the fluid space 602 and the outside communicate with each other as shown in FIG. 10. In this case, the lens barrel 50 may have a vent hole 501 through which the inside and the outside of the lens barrel 50 communicate with each other as shown in FIG. 10.

In one modification example of the second embodiment, the heat dissipation fluid 2603 may be a fluid other than liquid metal such as water. In another modification example of the first and second embodiments, the camera module 1 may be mounted on an object other than a vehicle.

Additional advantages and modifications will readily occur to those skilled in the art. The disclosure in its broader terms is therefore not limited to the specific details, representative apparatus, and illustrative examples shown and described.

What is claimed is:

1. A camera configured to capture an optical image of a target area, the camera comprising:
   a lens configured to receive light from the target area;
   an imager that has a curved portion convex in a direction away from the lens, the imager being configured to capture the optical image formed on the curved portion by the light that passed through the lens;
   a light transmitting material that optically couples the lens and the imager, the light transmitting material transmitting the light from the lens toward the imager; and
   a seat having
      a support that supports an outer rim of the imager, and
      a fluid space defined inside the support, a heat dissipation fluid undergoing convection in the fluid space, wherein:
   the curved portion is interposed between the light transmitting material and the seat,
   a surface of the light transmitting material from which the light is output is directly stacked on a surface of the imager to which the light is input,
   the light transmitting material is made of glass, and
   the light transmitting material has a thick plate shape and is sandwiched by the lens member and the imager.

2. The camera according to claim 1, wherein air is enclosed in the fluid space as the heat dissipation fluid.

3. The camera according to claim 1, wherein a liquid is enclosed in the fluid space as the heat dissipation fluid.

4. The camera according to claim 1, wherein the support supports the outer rim of the imager on which the optical image is not formed.

5. The camera according to claim 1, further comprising:
   an imaging substrate connected to the imager by wire bonding, wherein
   the support has a cylindrical shape, and
   the imaging substrate is exposed to the fluid space from another side of the support that is an opposite side from the side on which the curved portion is located.

6. The camera according to claim 5, further comprising a lens barrel configured to hold the lens and the light transmitting material, wherein
   the seat and the lens barrel are fixed to the imaging substrate.

7. The camera according to claim 1, wherein
the lens has an output lens surface convex toward the imager, and
the lens is configured to give positive power to the light.

8. The camera according to claim 7, wherein
the light transmitting material has
an input concave surface flush against the output lens surface, and
an output convex surface flush against the curved portion.

9. The camera according to claim 8, wherein
the output lens surface and the input concave surface are physically bonded to each other.

10. The camera according to claim 1, wherein
the camera is configured to capture the target area of an outside of a vehicle.

* * * * *